(12) United States Patent
Utsumi

(10) Patent No.: US 11,223,339 B2
(45) Date of Patent: Jan. 11, 2022

(54) SOUND CONTROL DEVICE FOR VEHICLE AND SOUND CONTROL METHOD FOR VEHICLE

(71) Applicant: MITSUBISHI ELECTRIC CORPORATION, Tokyo (JP)

(72) Inventor: Tsuyoshi Utsumi, Tokyo (JP)

(73) Assignee: MITSUBISHI ELECTRIC CORPORATION, Tokyo (JP)

(\*) Notice: Subject to any disclaimer, the term of this patent is extended or adjusted under 35 U.S.C. 154(b) by 0 days.

(21) Appl. No.: 16/962,370

(22) PCT Filed: Feb. 6, 2018

(86) PCT No.: PCT/JP2018/003970
§ 371 (c)(1),
(2) Date: Jul. 15, 2020

(87) PCT Pub. No.: WO2019/155515
PCT Pub. Date: Aug. 15, 2019

(65) Prior Publication Data
US 2020/0350883 A1 Nov. 5, 2020

(51) Int. Cl.
*H03G 3/20* (2006.01)
*H03G 3/32* (2006.01)
*G06F 3/16* (2006.01)
*H04R 29/00* (2006.01)

(52) U.S. Cl.
CPC ............... *H03G 3/32* (2013.01); *G06F 3/165* (2013.01)

(58) Field of Classification Search
CPC .................................. H03G 3/32; G06F 3/165
USPC ............................................................ 381/86
See application file for complete search history.

(56) References Cited

U.S. PATENT DOCUMENTS

| 5,524,060 | A | * | 6/1996 | Silfvast | H03G 3/00 381/104 |
| 2011/0106440 | A1 | * | 5/2011 | Adradi | G01C 21/12 701/532 |
| 2013/0253933 | A1 | * | 9/2013 | Maruta | B60R 16/0373 704/246 |
| 2016/0029111 | A1 | * | 1/2016 | Wacquant | H04R 3/005 381/71.4 |
| 2016/0080861 | A1 | * | 3/2016 | Helm | H04R 3/00 381/86 |

FOREIGN PATENT DOCUMENTS

JP  2006-214465 A  8/2006

\* cited by examiner

*Primary Examiner* — Ammar T Hamid
(74) *Attorney, Agent, or Firm* — Birch, Stewart, Kolasch & Birch, LLP

(57) ABSTRACT

A vehicle speed detecting unit detects a vehicle speed. A threshold changing unit changes a threshold in accordance with the vehicle speed detected by the vehicle speed detecting unit. A gain calculating unit calculates a gain value of an input sound inputted to a microphone. A sound control unit mutes the input sound when the gain value of the input sound is equal, to or greater than the threshold changed by the threshold changing unit, the gain value being calculated by the gain calculating unit.

6 Claims, 5 Drawing Sheets

SOUND CONTROL DEVICE FOR VEHICLE AND SOUND CONTROL METHOD FOR VEHICLE

TECHNICAL FIELD

The present disclosure relates to a sound control device for vehicle for and a sound control method for vehicle of muting an excessive input sound inputted to a microphone.

BACKGROUND ART

An active vibration control device according to Patent Literature 1 cancels out a vibration sound propagating through the vehicle body of a vehicle by generating a control sound for the vibration sound and then causing both the vibration sound and the control sound to interfere with each other. The above-mentioned activity vibration control device has a detecting means for detecting the presence of a road information system that consists of projecting and recessed portions arranged on a road surface in order to notify occupants in the vehicle of certain information by means of vibrations transmitted from the road surface. When the presence of the road information system is detected by the detecting means, the above-mentioned activity vibration control device does not cancel out the vibration sound generated by this road information system. The detecting means compares the vibration sound propagating through the vehicle body of the vehicle with a threshold, and, when the vibration sound is greater than the threshold, determines that a road information system is present.

CITATION LIST

Patent Literature

Patent Literature 1: 2006-214465 A

SUMMARY OF INVENTION

Technical Problem

A car navigation device has a microphone for performing in-vehicle conversation (so-called "in car communication (ICC)") hands free communication. The above-mentioned car navigation device has an excessive input detecting unit in order to prevent an unpleasant sound from being outputted to the partner in either the in-vehicle conversation or the handsfree communication. The excessive input detecting unit compares the sound pressure of the sound inputted via the microphone with a threshold. When the excessive input detecting unit determines that the sound pressure is excessive, the above-mentioned car navigation device performs an operation of muting either the input to the microphone or the output of a speaker.

The above-mentioned car navigation device has a structure in which the microphone is mounted in a design surface or a structure in which the microphone is mounted externally in a steering column or the like. In both of the structures, an operation sound of a button disposed in the design surface, an operation sound of a direction indicator, or the like is inputted to the microphone. Further, also when an occupant touches the microphone directly, a touch noise caused by the touch is inputted to the microphone.

The above-mentioned operation sound and touch noise become an unpleasant sound when the partner in either the in vehicle conversation or the handsfree communication hears the sound. In order to prevent an unpleasant sound from being heard by the partner, the above-mentioned car navigation device needs to perform excessive input detection using the above-mentioned excessive input detecting unit, and a temporary muting operation. Further, the above-mentioned excessive input detecting unit needs to lower the threshold in order to make it likely for an unpleasant sound to be detected.

However, a problem is that when low the threshold too much, the excessive input detecting unit frequently detects a loud uttered voice at the time of in-vehicle conversation or handsfree communication, a vibration sound occurring when the vehicle is traveling on road surface projecting and recessed portions, such as ruts, or the like, and thereby muting is erroneously performed. When erroneous muting occurs frequently, a feeling of discomfort is provided for the partner in either the in-vehicle conversation or the handsfree communication, or no conversation is established.

The present disclosure is made in order to solve the above-mentioned problem, and it is the therefore an object of the present disclosure to provide a technique for suppressing an unpleasant sound included in an input sound wile preventing a frequent occurrence of erroneous muting.

Solution To Problem

A sound control device vehicle according to the present disclosure includes: processing circuitry to detect a vehicle speed; to change a threshold in accordance with the vehicle speed detected; to calculate a gain value of an input sound inputted to a microphone; and to mute the input sound when the calculated gain value of the input sound is equal to or greater than the threshold changed.

Advantageous Effects of Invention

According to the present disclosure, because the threshold is changed in accordance with the vehicle speed, an unpleasant sound included in the input sound can be suppressed while a frequent occurrence of erroneous muting is prevented.

DESCRIPTION OF EMBODIMENTS

Hereinafter, in order to explain the present disclosure in greater detail, embodiments of the present disclosure will be described with reference to the accompanying drawings.

Embodiment 1

Figure 1:
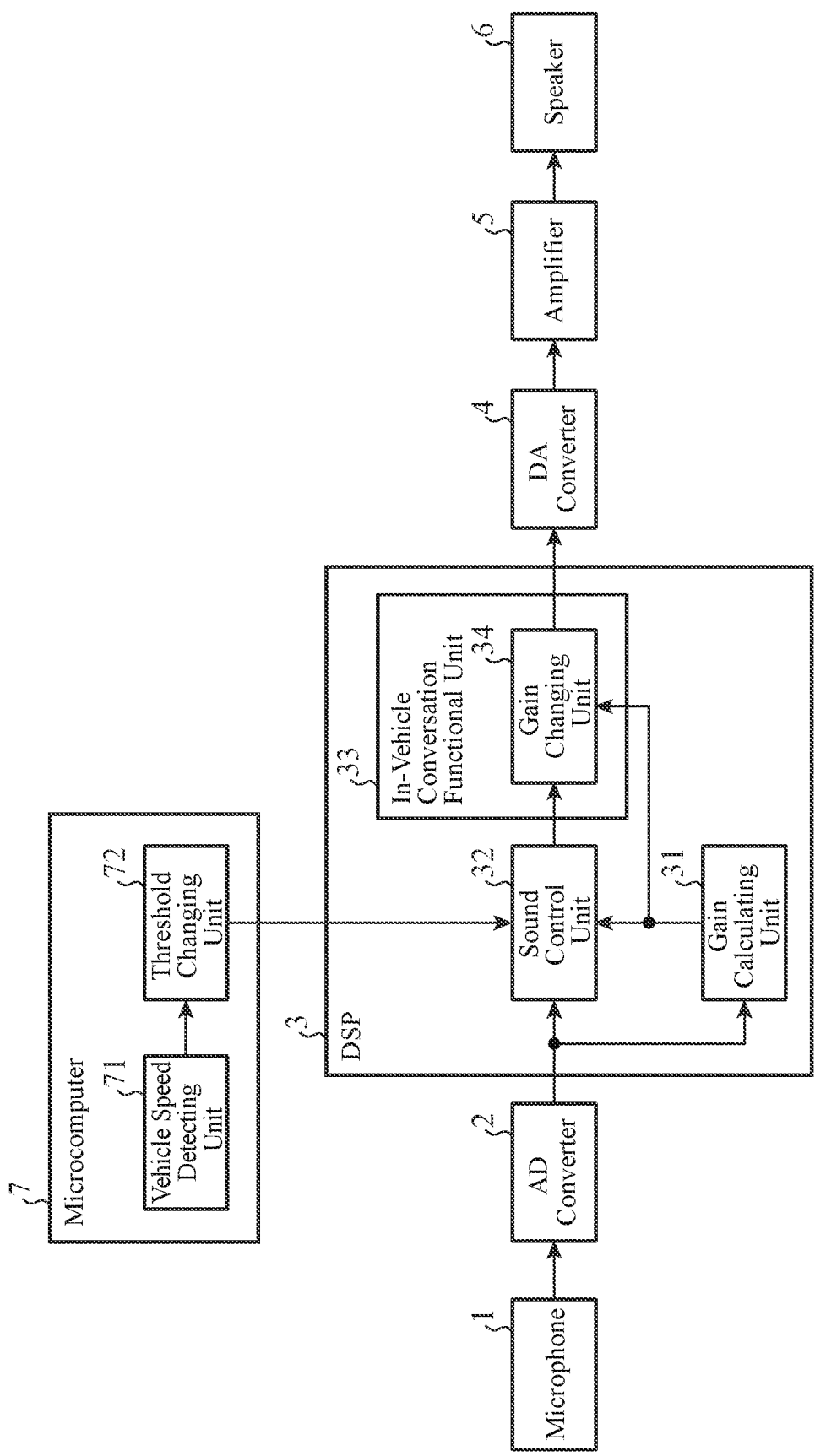
FIG. 1 is a block diagram showing an example of the configuration of a sound control device for vehicle according to Embodiment 1.

FIG. 1 is a block diagram showing an example of the configuration of a sound control device for vehicle according to Embodiment 1. The sound control device for vehicle includes at least a digital signal processor 3 (referred to as "DSP 3" hereinafter) and a microcomputer 7 (referred to as "micom 7" hereinafter). The DSP 3 includes a gain calculating unit 31, a sound control unit 32, an in-vehicle conversation functional unit 33, and a gain changing unit 34. The micom 7 includes a vehicle speed detecting unit 71 and a threshold changing unit 72. Further, in the example of FIG. 1, a microphone 1 and an analog digital (AD) converter 2 are connected to an input side of the DSP 3, and a digital analog (DA) converter 4, an amplifier 5, and a speaker 6 are connected to an output side of the DSP 3.

Figure 2:
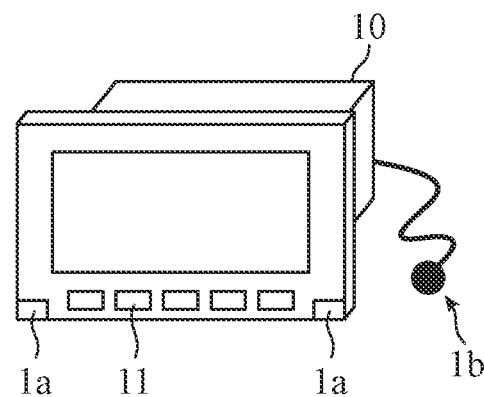
FIG. 2 is an appearance perspective view showing the example of the configuration of the sound control device for vehicle according to Embodiment 1.

FIG. 2 is an appearance perspective view showing the example of the configuration of the sound control device for vehicle according to Embodiment 1. In the example of FIG. 2, the sound device for vehicle is constructed integrally with a vehicle-mounted device for such as a car navigation device. One or more built-in microphones 1a and one or more operation buttons 11 are provided in a design surface of the vehicle-mounted device 10. Further, the vehicle-mounted device 10 includes an external microphone 1b provided on, for example, an upper surface of the steering column. The built-in microphones 1a or the external microphone 1b which are shown in FIG. 2, corresponds to the microphone 1 shown in FIG. 1.

In Embodiment 1, an example in which an in-vehicle conversation function is implemented using the sound control device for vehicle will be explained.

The microphone 1 is provided in the vicinity of a driver's seat. The driver's uttered voice is inputted to the microphone 1. The speaker 6 is provided in the vicinity of a rear seat. The speaker 6 outputs by voice the driver's uttered voice inputted to the microphone 1 to an occupant in the rear seat. As a result, the occupant in the rear seat can easily catch the voice that the driver has uttered while facing forward. Because the driver is sitting in front of the occupant in the rear seat, the driver can directly catch a voice that the occupant in the rear seat has uttered while facing forward.

Not only the driver's uttered voice but also a button operation sound occurring when the driver or the like operates the operation button 11 of the vehicle-mounted device 10, an operation sound, such as a blinker operation sound, occurring when the driver operates a vehicle-mounted device such as a direction indicator, a touch noise occurring when the driver or the like touches the microphone 1, a traveling noise occurring when a vehicle is traveling on ruts or road surface projecting and recessed portions of the road information system as mentioned above or the like, and so on are inputted to the microphone 1. A sound inputted to the microphone 1 including the driver's uttered voice, the button operation sound, the operation sound such as a blinker operation sound, the touch noise, and the traveling noise is referred to as an "input sound." The input sound inputted to the microphone 1 is converted from the analog signal into a digital signal by the AD converter 2, and the digital signal is inputted to the gain calculating unit 31 and the sound control unit 32 of the DSP 3.

The above-mentioned button operation sound, operation sound such as a blinker operation sound, touch noise, traveling noise, and so on which are superposed onto the driver's uttered voice are unpleasant for the occupant in the rear seat who is the conversation partner of the driver. Accordingly, when an unpleasant sound is superposed onto the driver's uttered voice, the sound control device for vehicle of Embodiment 1 mutes the input sound. The button operation sound, which is a target for muting, occurs mainly in the case where the vehicle is at rest or traveling at a low speed, and the operation sound such as a blinker operation sound occurs mainly in the case where the vehicle is traveling. The touch noise can occur both in the case where the vehicle is at rest and in the case where the vehicle is traveling. Further, the driver's loud uttered voice and the traveling noise, which are likely to be muted erroneously, occur mainly in the case where the vehicle is traveling.

In Embodiment 1, in order to mute the button operation sound, the operation sound such as a blinker operation sound, and the touch noise, but not to mute the driver's loud uttered voice and the traveling noise, a threshold for determining whether or not to perform muting is changed in the micom 7 in accordance with the vehicle speed.

Concretely, the vehicle speed detecting unit 71 receives a vehicle speed signal from the vehicle, to detect the vehicle speed. The vehicle speed detecting unit 71 outputs the vehicle speed to the threshold changing unit 72.

The threshold changing unit 72 receives the vehicle speed from the vehicle speed detecting unit 71, and changes the threshold in accordance with the vehicle speed.

Figure 3:
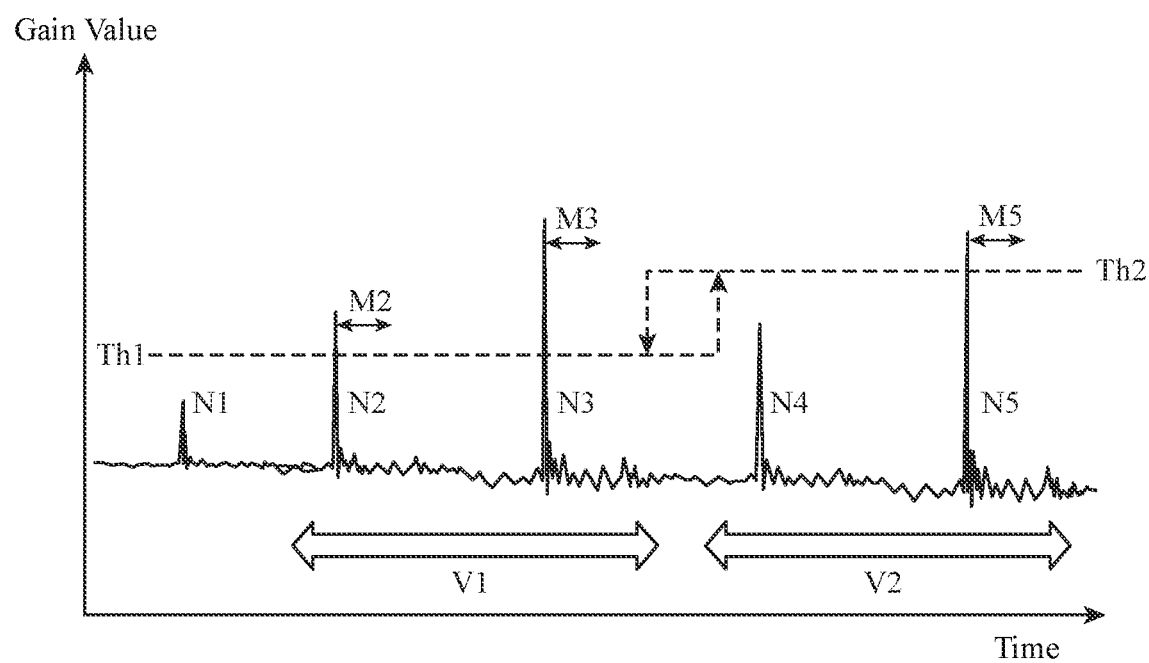
FIG. 3 is a graph showing an example of a threshold in Embodiment 1, in which the vertical axis shows a gain value of an input sound and the horizontal axis shows a time.

FIG. 3 is a graph showing an example of the threshold in Embodiment 1. The vertical axis of the graph shows a gain value of the input sound, i.e., the amplitude value of the input sound, and the horizontal axis shows a time. For example, in the threshold changing unit 72, a first threshold Th1 and a second threshold Th2 greater than the first threshold Th1 are predetermined as the threshold, and a first speed V1 (e.g., 10 km/h) and a second speed V2 (e.g., 15 km/h) greater than the first speed V1 are predetermined as vehicle speeds for determining whether or not to switch between the thresholds. The first speed V1 is intended for switching to the first threshold Th1 for muting the button operation sound from the vehicle-mounted device 10, die button operation sound occurring mainly in the case where the vehicle is at rest or traveling at a low speed. The first threshold Th1 is a gain value less than the gain value of the above-mentioned button operation sound. The second speed V2 is intended for switching to the second threshold Th2 for not muting the driver's loud uttered voice and the traveling noise when the vehicle is traveling on road surface projecting and recessed portions, the driver's loud uttered voice and the traveling noise occurring mainly in the case where the vehicle is traveling. The second threshold Th2 is a gain value greater than the gain value of the above-mentioned button operation sound and greater than the gain values of the driver's loud uttered voice and the traveling noise. When the vehicle speed exceeds the second speed V2, the threshold changing unit 72 switches from the first threshold Th1 to the second threshold Th2, and, when the vehicle speed becomes less than the first speed V1, the threshold changing unit 72 switches from the second threshold Th2 to the first threshold Th1.

Further, because a hysteresis is provided between the first threshold Th1 and the second threshold Th2, a dead zone is present between the first speed V1 and the second speed V2. Because the dead zone is present, frequent switching between the first threshold Th1 and the second threshold Th2 when the vehicle is traveling at a speed close to the first speed V1 and the second speed V2 is prevented.

Although the example of changing the threshold between the two levels: the first threshold Th1 and the second threshold Th2 in accordance with the vehicle speed is shown in FIG. 3, the threshold may be changed among any number of levels.

Noises N1 to N5 and mute periods M2, M3, and M5 shown in FIG. 3 will be mentioned later.

The gain calculating unit 31 receives the input sound from the AD converter 2 and calculates the gain value of the input sound. The gain calculating unit 31 outputs the gain value of the input sound to the sound control unit 32 and the gain changing unit 34.

The sound control unit 32 receives the gain value of the input sound from the gain calculating unit 31 and receives the threshold from the threshold changing unit 72, and compares the gain value of the input sound with the threshold. The sound control unit 32 receives the input sound from the AD converter 2 and mutes a part of the received input sound, the gain value of the part being equal to or greater than the threshold. As mentioned above, the threshold is switched between the first threshold Th1 and the second threshold Th2 in accordance with the vehicle speed. For example, the sound control unit 32 mutes the input sound until a predetermined mute time period (e.g., 20 ms) elapses since the sound control unit 32 has determined that the gain value of the input sound is equal to or greater than the threshold. The sound control unit 32 outputs the input sound after the muting process to the gain changing unit 34 of the in-vehicle conversation functional unit 33.

While the vehicle is traveling at the first speed V1 within a first half period of the graph of FIG. 3, because the noise N1 is, for example, a button operation sound having a small gain value and this gain value is less than the first threshold Th1, the noise N1 is not muted. Because the noise N2 is, for example, a button operation sound having a middle pain value and this gain value is equal to or greater than the first threshold Th1, muting is performed during the mute period M2. Further, because the noise N3 is, for example, a button operation sound, an operation sound such as a blinker operation sound, a touch noise, or the like having a large gain value and this gain value is equal to or greater than the first threshold Th1, muting is performed during the mute period M3. In this way, the sound control device for vehicle of Embodiment 1 lowers the threshold during a time period during which the vehicle is at rest or traveling at a low speed, to mute the unpleasant button operation sound, the operation button 11 being frequently operated during the time period.

In contrast, while the vehicle is traveling at the second speed V2 within a second half period of the graph of FIG. 3, because the noise N4 has a gain value similar to that of the noise N2, but this gain value is less than the second threshold Th2, the noise N4 is not muted. Because the noise N5 is, for example, a button operation sound, an operation sound such as a blinker operation sound, a touch noise, or the like having a large gain value and this gain value is equal to or greater than the second threshold. Th2, muting is performed during the mute period M5. A vibration sound or the like propagating inside the vehicle becomes large with increase in the vehicle speed. Because the noise N4 having a middle gain value disappears in the vibration sound or the like propagating inside the vehicle and thereby becomes unnoticeable, it is not necessary to mute the noise N4. Although the driver tries to speak in a loud voice when the vibration sound or the like propagating inside the vehicle becomes large, the driver's loud uttered voice is less likely to be erroneously muted because the threshold also increases in accordance with the vehicle speed. Further, although the traveling noise when the vehicle is traveling on road surface projecting and recessed portions also becomes large with increase in the vehicle speed, the traveling noise is less likely to be erroneously muted because the threshold also increases in accordance with the vehicle speed.

Figure 4:
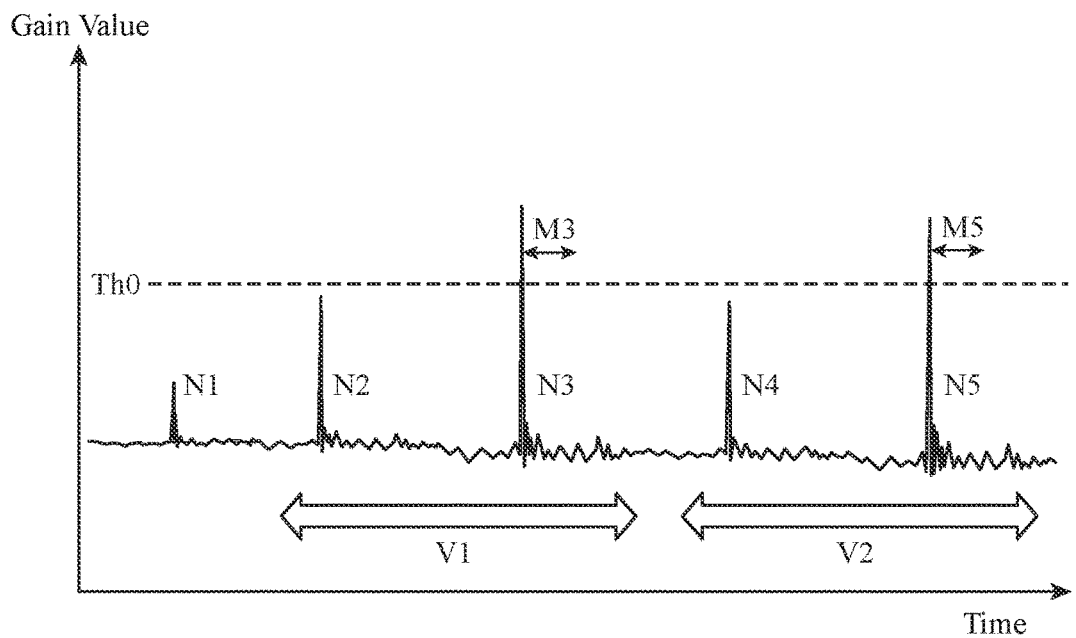
FIG. 4 a graph showing a reference example for helping the understanding of the sound control device for vehicle according to Embodiment 1, in which the threshold is constant.

FIG. 4 is a graph showing a reference example in which the threshold is constant, for helping the understanding of the sound control device for vehicle according to Embodiment 1. As shown in FIG. 4, when the threshold Th0 is constant regardless of the vehicle speed, the noise N2 is not muted and thus displeasure is provided for the occupant in the rear seat who is the in-vehicle conversation partner. When the threshold Th0 is lowered in order to mute the noise N2, the muting is performed not only at the time of occurrence of the noise N2 but also at the time of occurrence of the noise N4. Further, the driver's loud uttered voice and the traveling noise are likely to be erroneously muted. Due to frequent erroneous muting, a feeling of discomfort is provided for the occupant in the rear seat who is the in-vehicle conversation partner, or no conversation is established between the driver and the occupant in the rear seat.

The in-vehicle conversation functional unit 33 performs the in-vehicle conversation function in accordance with an instruction of either the driver or the occupant in the rear seat. During the performance of the in-vehicle conversation function, the in-vehicle conversation functional unit 33 receives the input sound from the sound control unit 32 and outputs the input sound to the DA converter 4 as an output sound.

The output sound outputted from the in-vehicle conversation functional unit 33 is converted from the digital signal into an analog signal in the DA converter 4, and the analog signal is outputted to the amplifier 5. The amplifier 5 amplifies the analog signal of the output sound and outputs the amplified analog signal to the speaker 6. The speaker 6 outputs by voice the output sound received from the amplifier 5 to the occupant in the rear seat.

The in-vehicle conversation functional unit 33 may include the gain changing unit 34. This gain changing unit 34 changes the gain value of the output sound to be outputted from the in-vehicle conversation functional unit 33 in proportion to the gain value of the input sound received from the gain calculating unit 31. More specifically, when the average of the gain of the input sound during a predetermined period is low, the gain changing unit 34 reduces the sound volume of the output sound by reducing the gain value of the output sound, thereby making the unpleasant sound included in the input sound unnoticeable. When the gain value of the input sound is small, the vehicle is at rest or traveling at a low speed, thus the vibration sound or the like propagating inside the vehicle is small, and thus the interior of the vehicle is relatively quiet. As a result, direct conversation can be performed between the driver and the occupant in the rear seat even when the sound volume of the output sound is small. In contrast, when the average of the gain of the input sound during the predetermined period is high, the gain changing unit 34 increases the sound volume of the output sound by increasing the gain value of the output sound. When the gain value of the input sound is large, the vehicle is traveling, thus the vibration sound or the like propagating inside the vehicle is large, and thus the interior of the vehicle is relatively noisy. For this reason, the gain changing unit 34 causes the driver's uttered voice to be outputted from the speaker 6 to the occupant in the rear seat at a large sound volume by increasing the gain value of the output sound, thereby supporting the in-vehicle conversation.

Figure 5:
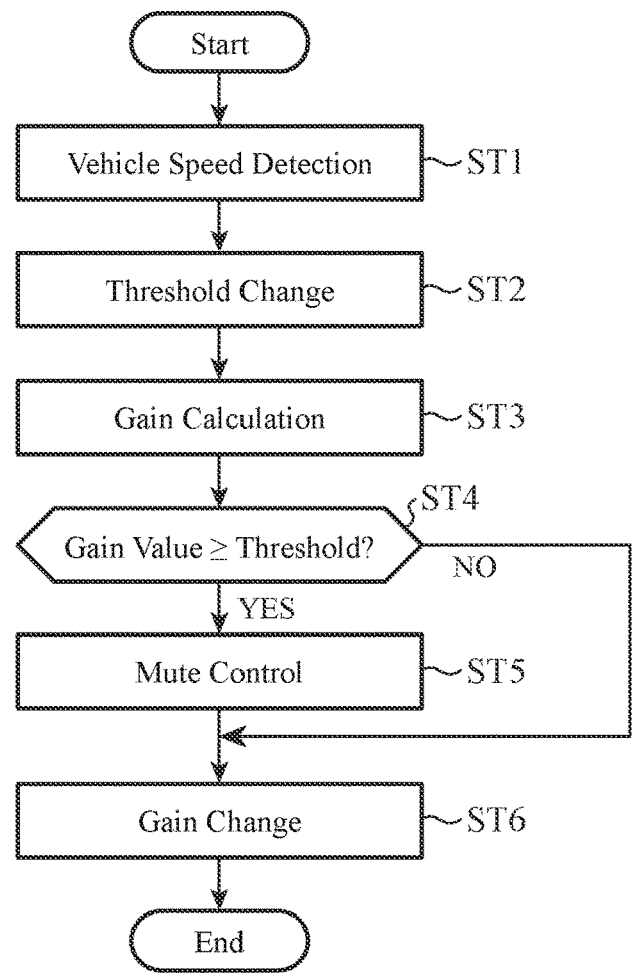
FIG. 5 is a flowchart showing an example of the operation of the sound control device for vehicle according to Embodiment 1.

FIG. 5 is a flowchart showing an example of the operation of the sound control device for vehicle according to Embodiment 1.

In step ST1, the vehicle speed detecting unit 71 detects the vehicle speed. In step ST2, the threshold changing unit 72 changes the threshold in accordance with the vehicle speed detected in step ST1. In step ST3, the gain calculating unit 31 calculates the gain value of the input sound inputted from the microphone 1 provided in the vicinity of the driver's seat.

In step ST4, the sound control unit 32 compares the gain value of the input sound calculated in step ST3 with the threshold changed in step ST2. When the gain value of the input sound is equal to or greater than the threshold ("YES" in step ST4), the sound control unit 32 proceeds to step ST5, whereas when the gain value of the input sound is less than the threshold ("NO" in step ST4), the processing proceeds to step ST6. In step ST5, the sound control unit 32 mutes the input sound during the predetermined time period.

In step ST6, the gain changing unit 34 changes the gain value of the output sound in proportion to the gain value of the input sound calculated in step ST3. The output sound after the gain value change is outputted by voice from the speaker 6 provided in the vicinity of the rear seat. In the flowchart of FIG. 5, the process of step ST6 by the gain changing unit 34 can be omitted.

As mentioned above, the sound control device for vehicle according to Embodiment 1 includes the vehicle speed detecting unit 71, the threshold changing unit 72, the gain calculating unit 31, and the sound control unit 32. The vehicle speed detecting unit 71 detects the vehicle speed. The threshold changing unit 72 changes the threshold in accordance with the vehicle speed detected by the vehicle speed detecting unit 71. The gain calculating unit 31 calculates the gain value of the input sound inputted to the microphone 1. When the gain value of the input sound calculated by the gain calculating unit 31 is equal to or greater than the threshold changed by the threshold changing unit 72, the sound control unit 32 mutes the input sound. As a result, the sound control device for vehicle can suppress an unpleasant sound included in the input sound while prevent frequent occurrence of erroneous muting.

Further, the sound control device for vehicle according to Embodiment 1 includes the gain changing unit 34 that changes the gain value of the output sound in proportion to the gain value of the input sound. As a result, the gain changing unit 34 can make an unpleasant sound included in the input sound, such as a button operation sound, unnoticeable in a situation in which the interior of the vehicle is relatively quiet.

Further, in Embodiment 1, the input sound includes operation sounds from the vehicle-mounted device 10, the direction indicator, and so on, and a traveling noise from the vehicle. The threshold changing unit 72 has, as the threshold, the first threshold Th1 for muting the operation sounds, and the second threshold Th2 greater than the first threshold Th1, for not muting the traveling noise. The threshold changing unit 72 switches between the first threshold Th1 and the second threshold Th2 in accordance with the vehicle speed detected by the vehicle speed detecting unit 71. As a result, the sound control device for vehicle can suppress the operation sound that is included in the input sound and is an unpleasant sound while preventing a frequent occurrence of erroneous muting resulting from the traveling noise.

Embodiment 2

The sound control device for vehicle according to Embodiment 1 has the configuration for muting an input sound in accordance with the vehicle speed. On the other hand, a sound control device for vehicle according to Embodiment 2 has a configuration for changing the frequency characteristic of an accordance with the vehicle speed, in addition to the configuration for muting the input sound in accordance with the vehicle speed.

Figure 6:
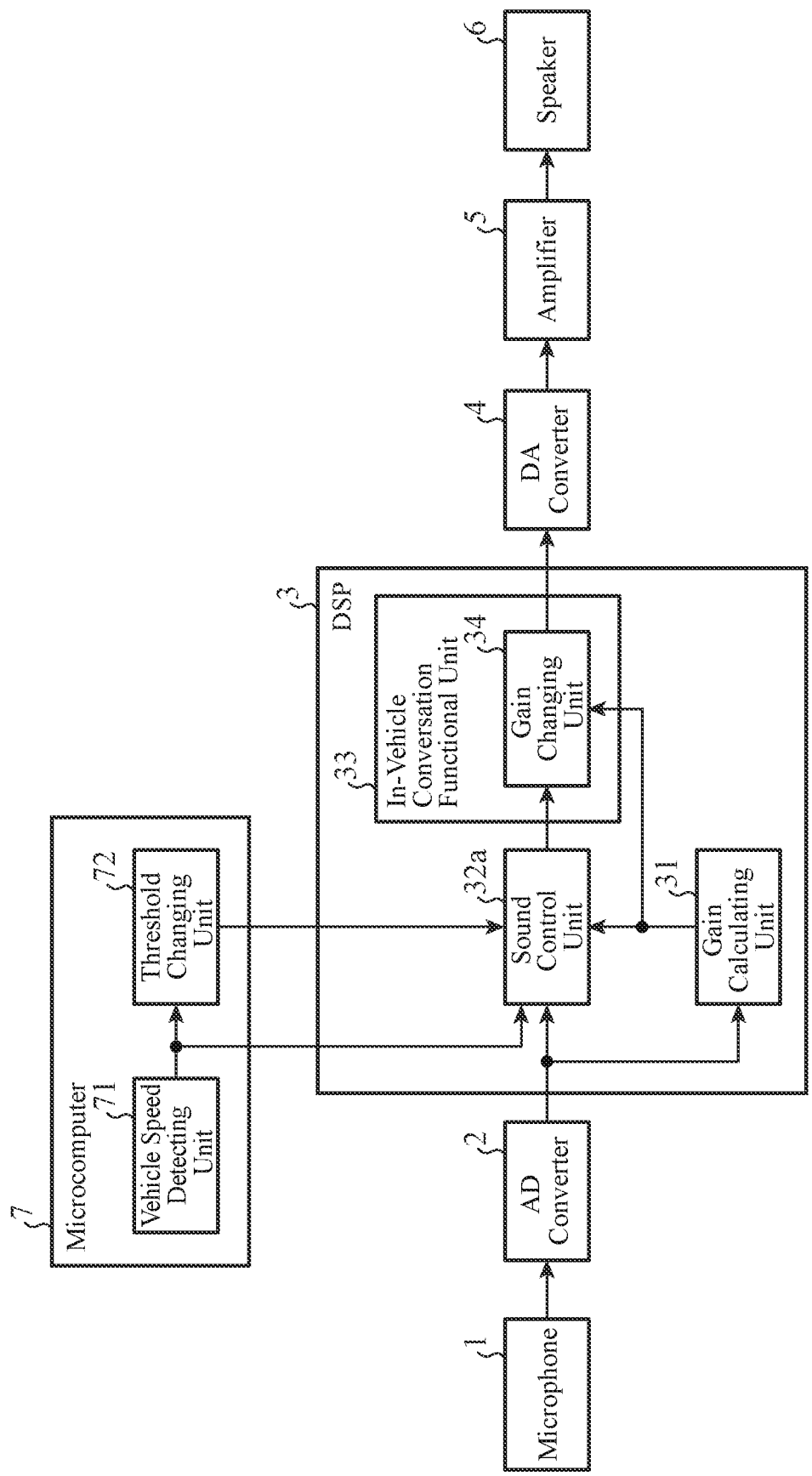
FIG. 6 is a block diagram showing an example of the configuration of a sound control device for vehicle according to Embodiment 2.

FIG. 6 is a block diagram showing an example of the configuration of the sound control device for vehicle according to Embodiment 2. The sound control device for vehicle according to Embodiment 2 includes a sound control unit 32a, instead of the sound control unit 32 in the sound control device for vehicle of Embodiment 1 shown in FIG. 1. In FIG. 6, components which are the same as or equivalent to those shown in FIGS. 1 to 5 are denoted by the same reference signs, and an explanation of the components will be omitted hereinafter.

Because the frequencies of a button operation sound and an operation sound such as a blinker operation sound are higher compared to the driver's uttered voice, the sounds are noticeable and are thus unpleasant sound for an occupant in a rear seat. Accordingly, the sound control unit 32a receives the vehicle speed from a vehicle speed detecting unit 71 and changes the frequency characteristic of the input sound in accordance with the vehicle speed, thereby making the button operation sound and so on unnoticeable. For example, when the vehicle speed detected by the vehicle speed detecting unit 71 is equal to or greater than a predetermined speed threshold, the sound control unit 32a does not change the frequency characteristic of the input sound, whereas when the vehicle speed is less than the speed threshold, the sound control unit 32a lowers the frequency characteristic of the input sound. In a situation in which the vehicle is at rest or traveling at a low speed, thus a vibration sound or the like propagating inside the vehicle is small, and thus the interior of the vehicle is relatively quiet, the sound control unit 32a lowers the frequency characteristic of the input sound, so that the button operation sound and so on become unnoticeable.

When a gain changing unit 34 reduces the gain value of the output sound in the situation in which the interior of the vehicle is relatively quiet, a feeling of discomfort is not provided for the occupant in the rear seat even though the sound control unit 32a changes the frequency characteristic.

As mentioned above, the sound control unit 32a of Embodiment 2 changes the frequency characteristic of an input sound in accordance with the vehicle speed detected by the vehicle speed detecting unit 71. As a result, the sound control unit 32a can make an unpleasant sound included in the input sound, such as a button operation sound, unnoticeable in a situation in which the interior of the vehicle is relatively quiet.

Embodiment 3

The sound control device for vehicle according to each of Embodiments 1 and 2 implements the in-vehicle conversation function. In contrast with this, a sound control device for vehicle according to Embodiment 3 implements a handsfree communication function.

Figure 7:
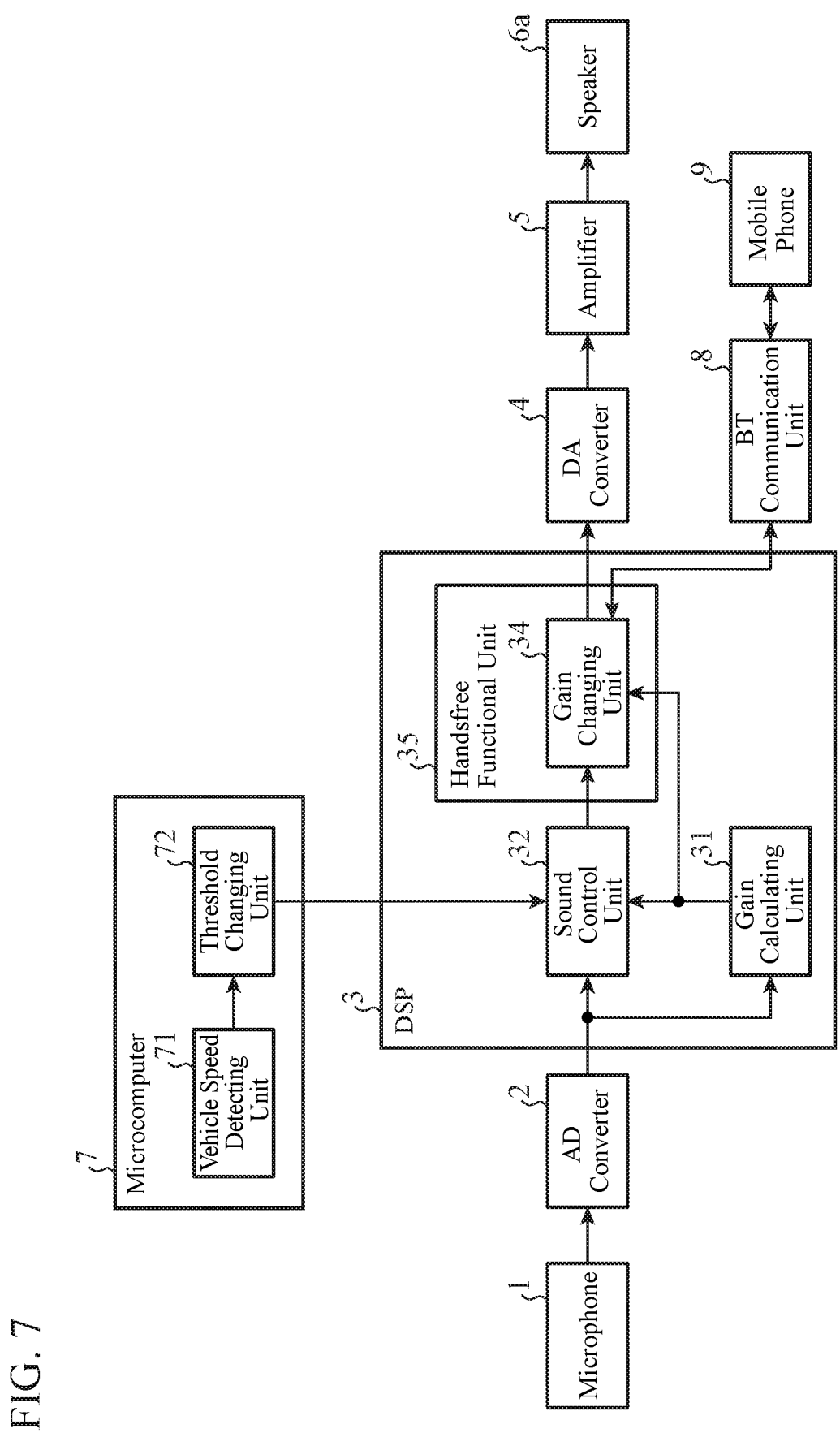
FIG. 7 is a block diagram showing an example of the configuration of a sound control device for vehicle according to Embodiment 3.

FIG. 7 is a block diagram showing an example of the configuration of the sound control device for vehicle according to Embodiment 3 The sound control device for vehicle according to Embodiment 3 includes a handsfree functional unit 35 and a speaker 6a, instead of the in-vehicle conversation functional unit 33 and the speaker 6 in the sound control device for vehicle of Embodiment 1 shown in FIG. 1, and further includes a Bluetooth (BT, a registered trademark) communication unit 8 and a mobile phone 9 in addition to the sound control device for vehicle of Embodiment 1. In FIG. 7, components which are the same as or equivalent to those of FIGS. 1 to 5 are denoted by the same reference signs, and an explanation of the components will be omitted hereinafter.

In Embodiment 3, an example in which the hands free communication function is implemented using the sound control device for vehicle will be explained.

A microphone 1 and the speaker 6a are provided in the vicinity of the driver's seat. The mobile phone 9 is carried in a vehicle, and can transmit and receive information to and from the handsfree functional unit 35 via the BT communication unit 8. Although in FIG. 7 Bluetooth (registered trademark) is provided as an example of a communication method of relaying information between the handsfree functional unit 35 and the mobile phone 9, no limitation to this communication method is intended. Further, the mobile phone 9 may be a smartphone or the like.

The driver's uttered voice inputted to the microphone 1 is outputted to the mobile phone 9 via an AD converter 2, a DSP 3, and the BT Communication unit 9, and thereby is outputted to a mobile phone (not illustrated) of a communication partner. An uttered voice of the communication partner is outputted to the speaker 6a Via the mobile phone (not illustrated) of the communication partner, the mobile phone 9, the BT communication unit 8, the handsfree functional unit 35, a DA converter 4, and an amplifier 5, and thereby is outputted by voice from the speaker 6a to the driver.

Like in the case of Embodiment 1, not only the driver's uttered voice but also a button operation sound occurring when the driver or the like operates an operation button 11 of a vehicle-mounted device 10, an operation sound, such as a blinker operation sound, occurring when the driver operates a vehicle-mounted device such as a direction indicator, a touch noise occurring when the driver or, the like touches the microphone 1, a traveling noise occurring when the vehicle is traveling on ruts or road surface projecting and recessed portions of the road formation system as mentioned above or the like, and so on are inputted to the microphone 1. The above-mentioned button operation sound, operation sound such as a blinker operation sound, touch noise, traveling noise, and so on which are superposed onto the driver's uttered voice are unpleasant for the communication partner. Accordingly, the sound control device for vehicle of Embodiment 3 suppresses an unpleasant sound included in an input sound while preventing a frequent occurrence of erroneous muting, like the sound control device for vehicle of Embodiment 1.

It is to be understood that any combination of two or more of the embodiments can be made, various changes can be made in any component according to any one of the embodiments, or any component according to any one of the embodiments can be omitted within the scope of the present disclosure.

For example, Embodiment 3 may be combined with Embodiment 1 or 2 in such a way that the sound control device for vehicle can perform both the in-vehicle conversation function and the handsfree communication function.

INDUSTRIAL APPLICABILITY

Because the sound control device for vehicle according to the present disclosure suppresses an unpleasant sound included in an input sound while preventing a frequent occurrence of erroneous muting, the sound control device is suitable for use as a sound control device for vehicle that implements at least one of the in-vehicle conversation function and the handsfree communication function, and so on.

REFERENCE SIGNS LIST 1 microphone, 1a built-in microphone, 1b external microphone, 2 AD converter, 3 DSP, 4 DA converter, 5 amplifier, 6, 6a speaker, 7 micom, 8 BT communication unit, 9 mobile phone, 10 vehicle-mounted device, 11 operation button, 31 gain calculating unit, 32, 32a sound control unit, 33 in-vehicle conversation functional unit, 34 gain changing unit, 35 handsfree functional unit, 71 vehicle speed detecting unit, 72 threshold changing unit, M2, M3, M5 mute period, N1 to N5 noise, Th0 threshold, Th1 first threshold, Th2 second threshold, V1 first speed, and V2 second speed.

The invention claimed is:

1. A sound control device for a vehicle comprising:
processing circuitry
to detect a speed of the vehicle;
to change a threshold in accordance with the detected speed of the vehicle;
to calculate a gain value of an input sound inputted to a microphone; and
to mute the input sound when the calculated gain value of the input sound is equal to or greater than the threshold changed, wherein
the input sound includes an operation sound from a vehicle-mounted device and a traveling noise from the vehicle, and
the processing circuitry has, as the threshold, a first threshold for muting the operation sound, and a second threshold greater than the first threshold, for not muting the traveling noise, and switches between the first threshold and the second threshold in accordance with the detected speed of the vehicle.

2. The sound control device for a vehicle according to claim 1, wherein the processing circuitry changes a gain value of an output sound in proportion to the gain value of the input sound.

3. The sound control device for a vehicle according to claim 1, wherein the processing circuitry changes a frequency characteristic of the input sound in accordance with the detected speed of the vehicle.

4. The sound control device for a vehicle according to claim 1, wherein the processing circuitry outputs the input sound inputted to the microphone provided in a vicinity of a driver's seat to a speaker provided in a vicinity of a rear seat.

5. The sound control device for a vehicle according to claim 1, wherein the processing circuitry outputs the input sound inputted to the microphone provided in a vicinity of a driver's seat to a handsfree communication partner.

6. A sound control method for a vehicle comprising:
detecting a speed of the vehicle;
changing a threshold in accordance with the detected speed of the vehicle;
calculating a gain value of an input sound inputted to a microphone; and
muting the input sound when the calculated gain value of the input sound is equal to or greater than the threshold changed, wherein the input sound includes an operation sound from a vehicle-mounted device and a traveling noise from the vehicle, and the threshold includes a first threshold for muting the operation sound, and a second threshold greater than the first threshold, for not muting the traveling noise, to enable switching between the first threshold and the second threshold in accordance with the detected speed of the vehicle.

\* \* \* \* \*